(12) United States Patent
Khoury et al.

(10) Patent No.: US 9,819,524 B2
(45) Date of Patent: Nov. 14, 2017

(54) IMAGE REJECTION CALIBRATION WITH A PASSIVE NETWORK

(71) Applicant: Silicon Laboratories Inc., Austin, TX (US)

(72) Inventors: John M. Khoury, Austin, TX (US); Navin Harwalkar, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 428 days.

(21) Appl. No.: 14/549,910

(22) Filed: Nov. 21, 2014

(65) Prior Publication Data

US 2016/0149604 A1 May 26, 2016

(51) Int. Cl.
| | |
|---|---|
| *H04L 27/06* | (2006.01) |
| *H01B 1/16* | (2006.01) |
| *H01B 1/10* | (2006.01) |
| *H04B 1/00* | (2006.01) |
| *H04B 1/04* | (2006.01) |
| *G01R 19/25* | (2006.01) |
| *G01R 23/165* | (2006.01) |

(52) U.S. Cl.
CPC ............ *H04L 27/06* (2013.01); *H04B 1/0021* (2013.01); *G01R 19/2506* (2013.01); *G01R 23/165* (2013.01); *H04B 2001/0416* (2013.01)

(58) Field of Classification Search
CPC ............... H04L 27/06; H04B 1/0021; H04B 2001/0416; G01R 23/00; G01R 23/16; G01R 23/165; G01R 23/167; G01R 27/28; G01R 19/00; G01R 19/0007; G01R 19/2506; G01R 31/31708; G01N 29/42; H01L 2924/14222; H03D 7/16; H03D 7/165; H03D 7/18; H03D 1/04
USPC ......... 324/76.11, 76.12, 76.19, 76.23, 76.39, 324/76.41, 76.43, 76.44, 76.52, 76.68, 324/123 R, 126
See application file for complete search history.

(56) References Cited

U.S. PATENT DOCUMENTS

| | | |
|---|---|---|
| 4,345,241 A | 8/1982 | Takeuchi et al. |
| 5,740,208 A | 4/1998 | Hulbert et al. |
| 6,456,316 B1 | 9/2002 | Jun |
| 6,606,010 B1 | 8/2003 | Poklemba et al. |
| 6,744,829 B1 | 6/2004 | Mohindra |
| 6,792,054 B1 | 9/2004 | Bitran et al. |

(Continued)

OTHER PUBLICATIONS

Keng Leong Fong, et al., "High_Frequency Nonlinearity Analysis of Common-Emitter and Differential-Pair Transconductance Stages," IEEE Journal of Solid State Circuits, vol. 33, No. 4, pp. 548-555. Apr. 1998.

(Continued)

*Primary Examiner* — Hoai-An D Nguyen
(74) *Attorney, Agent, or Firm* — Trop, Pruner & Hu, P.C.

(57) ABSTRACT

In one aspect, an apparatus includes: a mixer to receive a radio frequency (RF) signal and downconvert the RF signal into a second frequency signal; an amplifier coupled to the mixer to amplify the second frequency signal; an image rejection (IR) circuit coupled to the programmable gain amplifier (PGA) to orthogonally correct a gain and a phase of the amplified second frequency signal to output a corrected amplified second frequency signal; and a complex filter to filter the corrected amplified second frequency signal.

20 Claims, 10 Drawing Sheets

(56) References Cited

U.S. PATENT DOCUMENTS

| | | | |
|---|---|---|---|
| 6,892,060 B2* | 5/2005 | Zheng | H04B 1/28 375/346 |
| 6,959,016 B1 | 10/2005 | Keeth et al. | |
| 7,158,586 B2 | 1/2007 | Husted | |
| 7,477,881 B2* | 1/2009 | Kim | H04B 1/0032 375/324 |
| 7,522,899 B1 | 4/2009 | He | |
| 7,580,680 B2 | 8/2009 | Isaac et al. | |
| 7,636,558 B2 | 12/2009 | Olson | |
| 7,684,778 B1 | 3/2010 | Qian et al. | |
| 7,873,342 B2 | 1/2011 | Lim et al. | |
| 7,903,771 B2 | 3/2011 | Cho et al. | |
| 8,265,584 B2 | 9/2012 | Khoury et al. | |
| 8,326,252 B2 | 12/2012 | Li | |
| 2004/0002323 A1 | 1/2004 | Zheng | |
| 2005/0070236 A1 | 3/2005 | Paulus | |
| 2005/0089120 A1 | 4/2005 | Quinlan | |
| 2005/0135521 A1 | 6/2005 | Nemer et al. | |
| 2005/0148304 A1 | 7/2005 | Jerng | |
| 2005/0243949 A1 | 11/2005 | Khoini-Poorfard | |
| 2006/0003722 A1 | 1/2006 | Tuttle et al. | |
| 2007/0080835 A1 | 4/2007 | Maeda et al. | |
| 2007/0097271 A1 | 5/2007 | Gao et al. | |
| 2007/0237264 A1 | 10/2007 | Huang et al. | |
| 2008/0089397 A1 | 4/2008 | Vetter et al. | |
| 2008/0096513 A1* | 4/2008 | Lim | H04B 1/30 455/302 |
| 2009/0058705 A1 | 3/2009 | Cetin et al. | |
| 2010/0159858 A1 | 6/2010 | Dent et al. | |
| 2010/0167680 A1 | 7/2010 | Li et al. | |
| 2010/0330947 A1 | 12/2010 | Khoury et al. | |
| 2011/0086605 A1* | 4/2011 | Chanca | H04B 1/30 455/302 |
| 2011/0189970 A1 | 8/2011 | Ohshiro | |
| 2014/0376651 A1* | 12/2014 | Khoury | H03D 1/04 375/261 |

OTHER PUBLICATIONS

Keng Leong Fong, et al., "A Class AB Monolithic Mixer for 900 MHz Applications," IEEE Journal of Solid-State Circuits, pp. 1166-1172, Aug. 1997.

Keng Leong Fong, et al., "2.4 Monolithic Mixer for Wireless LAN Applications," IEEE Custom Integrated Circuits Conference, pp. 9.4.1-9.4.4, May 1997.

Stefaan Van Gerven, et al., "Signal Separation by Symmetric Adaptive Decorrelation: Stability, Convergence, and Uniqueness," IEEE Transactions on Signal Processing, vol. 43, No. 7, Jul. 1995, pp. 1602-1612.

Fred Harris, "Digital Filter Equalization of Analog Gain and Phase Mismatch in I-Q Receivers," 1996, pp. 793-796.

Stefaan Van Gerven, et al., "On the Use of Decorrelation in Scalar Signal Seprartion," IEEE, 1994, pp. 57-60.

Mikko Valkama, et al., "Advanced Methods for I/Q Imbalance Compensation in Communication Receivers," IEEE Transactions on Signal Processing, vol. 49, No. 10, Oct. 2001, 2335-2344.

Dirk Van Compernolle, et al., "Signal Separation in a Symmetric Adaptive Noise Canceller by Output Decorrelation," 1992, pp. 221-224.

Farbod Behbahani, et al., "CMOS Mixers and Polyphase Filters for Large Image Rejection," IEEE Journal of Solid-State Circuits, vol. 36, No. 6, Jun. 2001, pp. 873-887.

Li Yu, "A Novel Adaptive Mismatch Cancellation System for Quadrature IF Radio Receivers," 1997, pp. 1-123.

Supisa Lerstaveesin, et al., "A Complex Image Rejection Circuit With Sign Detection Only," IEEE Journal of Solid-State Circuits, vol. 41, No. 12, Dec. 2006, pp. 2693-2702.

U.S. Appl. No. 13/921,375, filed Jun. 19, 2013, entitled "Performing Image Rejection on Bandpass Signals," by John Khoury.

\* cited by examiner

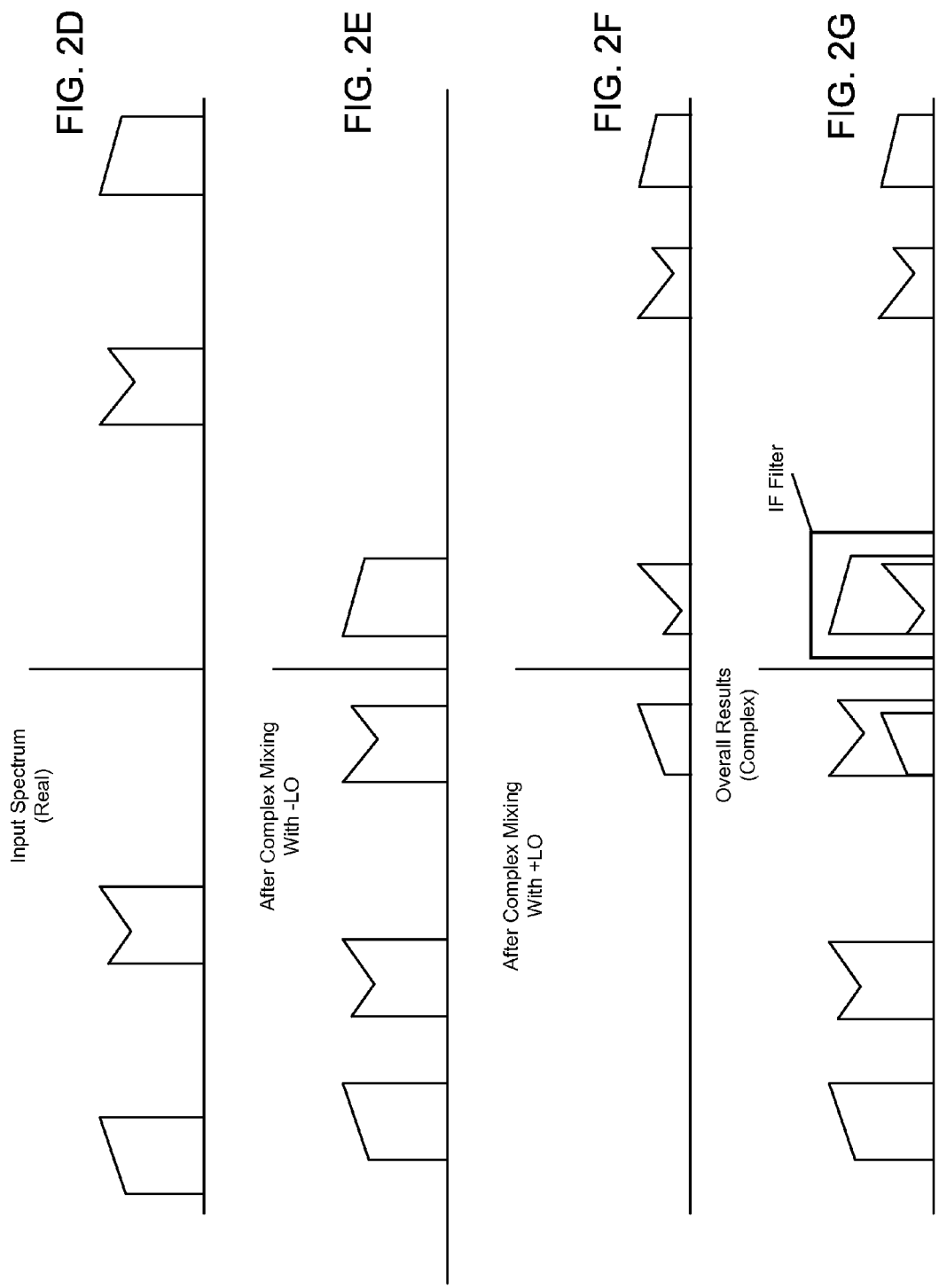

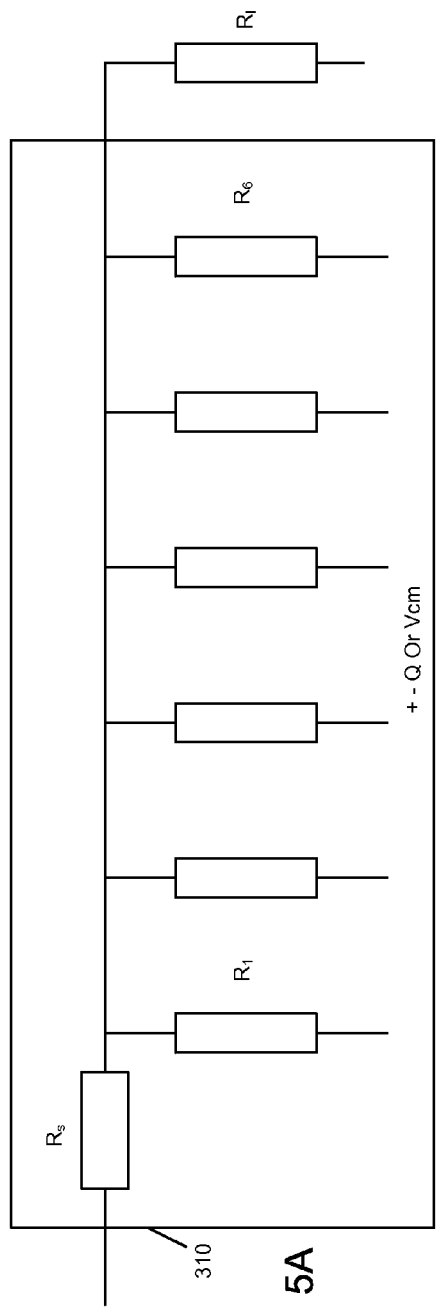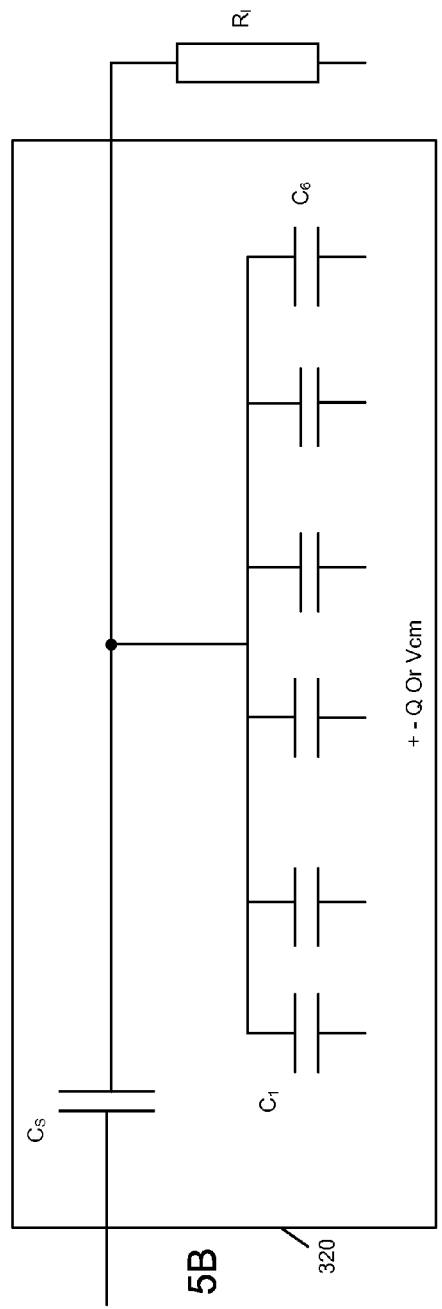
FIG. 5A
FIG. 5B

IMAGE REJECTION CALIBRATION WITH A PASSIVE NETWORK

BACKGROUND

Many receivers include an in-phase/quadrature (I/Q) demodulation architecture, in which a received modulated carrier signal is simultaneously applied to an I-channel mixer and a Q-channel mixer. A local oscillator (LO) is also applied to the mixers to effect frequency conversion from a radio frequency (RF) at which the radio signal is received to an intermediate frequency (IF). In an I/Q demodulator, the LO signal that is applied to the Q-channel mixer is offset by 90° from the LO signal that is applied to the I-channel mixer.

Image rejection is one metric by which receiver system performance may be evaluated. In general, image rejection refers to the ability of the receiver to reject responses resulting from RF signals at a frequency offset from the desired RF carrier frequency by an amount equal to twice the IF of a superheterodyne receiver. For example, if the desired RF signal is at 100 megahertz (MHz), and the receiver IF is 4 MHz, then the receiver LO could be tuned to 96 MHz. However, as is well known to those skilled in the art, the receiver will also exhibit a response to undesired RF signals (i.e., image signals) at a frequency 4 MHz below the LO frequency, in this case, 92 MHz. The receiver's response to the 92 MHz signal is referred to as the image response, because the image signal resides at a frequency on the other side of the LO frequency from the desired RF carrier, and offset from the LO frequency by the magnitude of the IF. A similar image signal appears to the high side when the LO is greater than the desired RF carrier and the image frequency is larger than the LO frequency.

In a typical low-IF receiver architecture, mismatch between in-phase and quadrature phase paths causes image interference cross-talk. In many receivers, one or more strong adjacent channels may become the image interference and make reception unacceptable.

SUMMARY OF THE INVENTION

In one aspect, an apparatus includes: a mixer to receive a radio frequency (RF) signal and downconvert the RF signal into a second frequency signal; a programmable gain amplifier (PGA) coupled to the mixer to amplify the second frequency signal; an image rejection (IR) circuit coupled to the PGA to orthogonally correct a gain and a phase of the amplified second frequency signal to output a corrected amplified second frequency signal; and a complex filter to filter the corrected amplified second frequency signal.

In one example, the IR circuit includes: a first controllable admittance network coupled to an in-phase signal path of the apparatus; and a second controllable admittance network coupled to a quadrature signal path of the apparatus. In another example, the IR circuit further includes: a third controllable admittance network coupled to the in-phase signal path of the apparatus; and a fourth controllable admittance network coupled to the quadrature signal path of the apparatus.

In an example, a first selection circuit may controllably couple each of a plurality of admittance elements of the first controllable admittance network to a selected one of a first portion of the quadrature signal path, a second portion of the quadrature signal path, or a common mode voltage node. A controller may be configured to send a control signal to the first selection circuit based on at least one operating characteristic of the apparatus. In turn, a non-volatile memory may be coupled to the controller, the non-volatile memory to store a plurality of entries each to store a control value to control at least the first selection circuit.

In another aspect, a method includes: injecting a tone into a receiver at a frequency of an image band; measuring a signal power in a desired band responsive to processing the injected tone in the receiver; if the signal power in the desired band is less than a threshold level, storing a setting of a phase correction circuit of an image rejection calibration circuit of the receiver in an entry of a non-volatile storage; and if the signal power in the desired band is greater than the threshold level, iteratively updating the setting of the phase correction circuit and measuring the signal power until the signal power is less than the threshold level, and thereafter storing the phase correction circuit setting in the non-volatile storage entry.

In some examples, the method may further include calibrating the phase correction circuit independently of a gain correction circuit of the receiver. The stored setting of the phase correction circuit may be sent as control information to the image rejection calibration circuit, when the receiver is operating at a first set of operating characteristics. The method also may include controlling a plurality of controllable admittance elements of the phase correction circuit responsive to the control information, including coupling each of the plurality of controllable admittance elements to a selected one of a first quadrature signal path node, a second quadrature signal path node, and a common voltage mode node.

In yet another aspect, a receiver includes: a complex mixer to downconvert a RF signal to a complex IF signal and an IF signal path coupled to the complex mixer. In an example, the IF signal path includes: an in-phase signal path to receive an in-phase IF signal and a quadrature signal path to receive a quadrature IF signal.

In one example, the in-phase signal path includes a phase correction circuit having: a first series admittance element; and a first plurality of parallel admittance elements to couple between the in-phase signal path and a selected one of a positive quadrature signal path node, a negative quadrature signal path node, and a first common mode voltage node.

In one example, the quadrature signal path includes a gain correction circuit having: a second series admittance element; and a second plurality of parallel admittance elements to couple between the quadrature signal path and a selected one of the positive quadrature signal path node, the negative quadrature signal path node, and a second common mode voltage node.

In an example, the receiver further includes a first selection circuit to controllably couple each of the first plurality of parallel admittance elements to the selected one of the positive quadrature signal path node, the negative quadrature signal path node, or the first common mode voltage node. The receiver also may include a controller to send a control signal to the first selection circuit based on one or more operating characteristics of the receiver.

In one example, the phase correction circuit further includes: a third series admittance element; and a third plurality of parallel admittance elements to couple between the quadrature signal path and a selected one of a positive in-phase signal path node, a negative in-phase signal path node, and a third common mode voltage node. Also, in an example, the gain correction circuit further includes: a fourth series admittance element; and a fourth plurality of parallel admittance elements to couple between the quadrature signal path and a selected one of the positive quadrature signal path node, the negative quadrature signal path node, and the second common mode voltage node.

BRIEF DESCRIPTION OF THE DRAWINGS

FIGS. 2D-2G are diagrams of an input spectrum received and processed in a radio receiver at an RF frequency, in accordance with an embodiment.

FIG. 5A is a schematic diagram of one implementation of a correction circuit implemented using passive attenuators.

FIG. 5B is a schematic diagram of a different example of a correction circuit in accordance with an embodiment.

DETAILED DESCRIPTION

Due to mismatches in an analog front end of a receiver having a complex signal path (i.e., in-phase (I) and quadrature (Q) signal paths), part of an interference (e.g., image) signal may be within a desired signal band (and vice-versa). Embodiments seek to prevent the interference signal from contaminating the desired signal. In embodiments herein, passive circuitry of a receiver can be used to remove undesired image information, at low power and low complexity. Further, this circuitry may be implemented in analog circuitry after initial downconversion and before digitization occurs.

Figure 1:
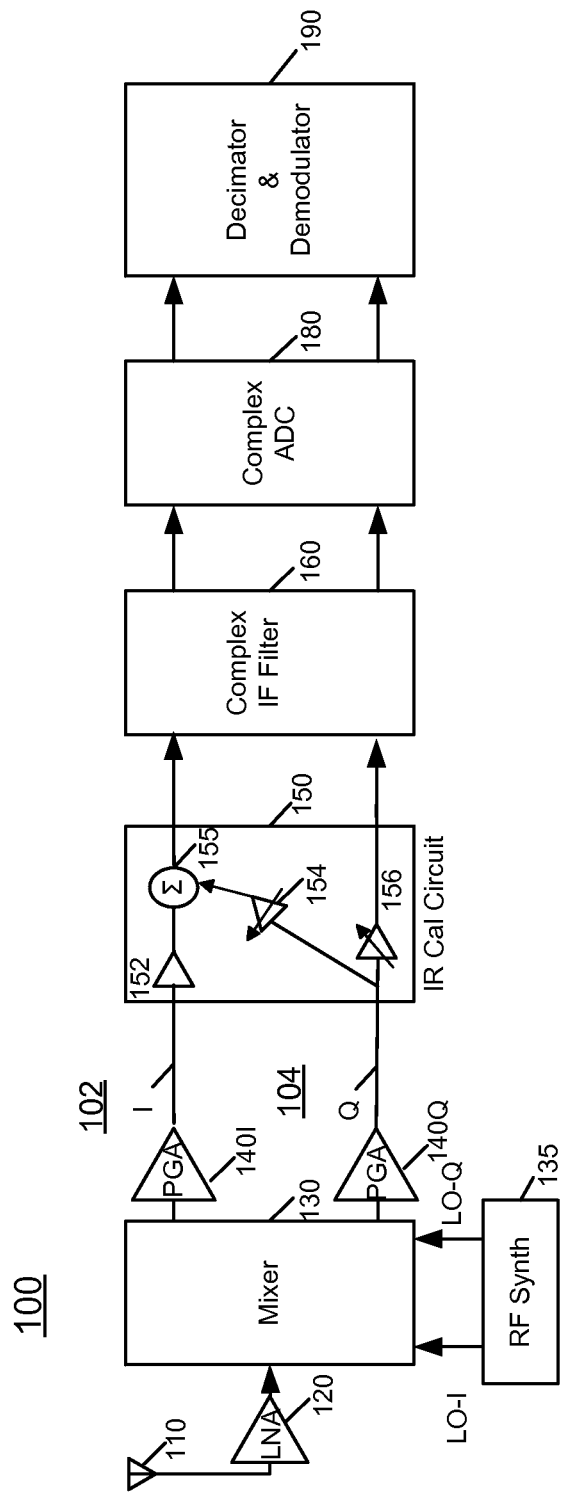
FIG. 1 is a block diagram of a receiver in accordance with an embodiment.

Referring now to FIG. 1, shown is a block diagram of a receiver in accordance with an embodiment. As shown in FIG. 1, receiver 100, which may be implemented on a single semiconductor die, is configured to receive and process an incoming radio frequency (RF) signal into a demodulated signal that can be provided for further, e.g., digital data processing and thereafter output to an intended location. In the illustration of FIG. 1, receiver 100 includes an antenna 110. Note that antenna 110 in a given implementation may be an off-chip antenna that receives RF signals and provides them to a low noise amplifier (LNA) 120.

Although embodiments vary, in one implementation receiver 100 may be configured to receive wireless signals within a wireless local area network, e.g., Bluetooth™ signals, Zigbee™ signals, WLAN signals or so forth. Such signals may be received at a selected frequency, which in an embodiment may be 2.4 GHz. The incoming RF signals, as amplified by LNA 120 are provided to a mixer 130 which in an embodiment is a complex filter that may be implemented as an N-path filter. As seen, an RF synthesizer 135 provides a complex local oscillator (LO) signal (namely signals LO-I and LO-Q) to mixer 130 to thus downconvert the incoming amplified RF signal to a lower frequency signal, which in an embodiment may be at an intermediate frequency (IF). Of course understand that in other receiver architectures, a mixer may operate to downconvert an incoming RF signal to another frequency such as a low-IF signal, near DC signal, baseband signal or so forth.

In the embodiment shown, receiver 100 is a complex receiver having an in-phase signal path 102 (also referred to herein as an "I path") and a quadrature signal path 104 (also referred to herein as a "Q path"). For ease of discussion, components within in-phase signal path 102 are discussed. Understand that similar components are present in quadrature signal path 104.

Still with reference to FIG. 1, the downconverted complex signals from mixer 130 are provided to a programmable gain amplifier (PGA) 140I/140Q where a controllable amount of gain may be provided to the signals. In turn, the amplified IF signals are provided to an IR calibration circuit 150. As will be described herein, IR calibration (IRCAL) circuit 150 may perform image rejection calibration in the analog signal path prior to any complex filtering, thus avoiding negating image band attenuation. At the high level of FIG. 1, IR calibration circuit 150 includes a gain block 152 in the in-phase signal path and an adder 155 to which a cross-coupled signal output from a phase correction circuit 154 is coupled. As seen, this phase correction circuit 154 is configured to receive an input signal from the quadrature phase signal path, which is further provided to an amplitude correction circuit 156 of the quadrature phase signal path. In various embodiments, the image rejection performed in IR calibration circuit 150 may occur in an orthogonal manner such that phase and amplitude correction is performed independently from each other and in any desired order, as corrections of phase do not affect signal amplitude and similarly, corrections of amplitude do not affect phase.

Referencing still to FIG. 1, the image rejection calibrated signals are provided to a complex IF filter 160, which performs complex filtering. The filtered signals are coupled to a complex analog-to-digital converter (ADC) 180, which may digitize the analog signals into a digital format to be provided to a decimator/demodulator 190 which may reduce a sample rate of the digitized signals and perform demodulation, among other processing. Understand while shown at this high level in the embodiment of FIG. 1, many variations and alternatives are possible.

Figure 2A:
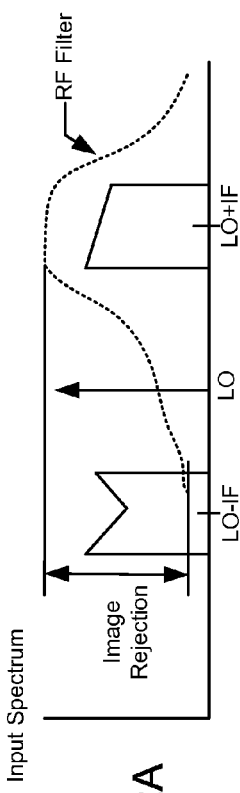
FIGS. 2A-2C are diagrams of an input spectrum received and processed in a superheterodyne radio receiver.
Figure 2B:
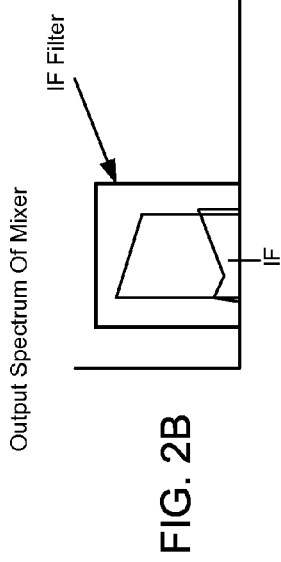
Figure 2C:
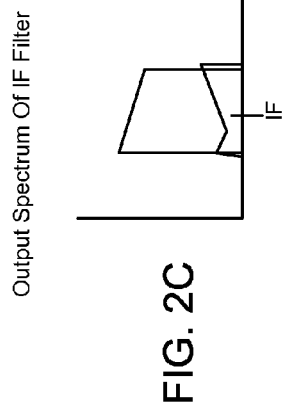

Referring to FIG. 2A, shown is an input spectrum as received in a traditional superheterodyne radio receiver at an RF frequency. As seen, with a low-side LO injection an image portion can be attenuated by an RF filter. When the resulting signal has been downmixed to an IF band, limited RF filter rejection results in image signal falling within the IF band (including both the desired and image channels). The mixer up-conversion terms, 2LO−IF and 2LO+IF, are rejected by an IF filter as shown in FIG. 2B. However, the output signal-to-noise ratio (SNR) may be limited by the image spectrum falling within the IF band as shown in FIG. 2C.

Image rejection requirements of a given receiver may be a function of: frequency separation of desired and image signals; power of an interferer signal as compared to a desired signal; and choice of IF frequency. In a modern low IF I/Q receiver, image rejection can be degraded by mismatches of amplitude/phase in LO signals and mismatches of amplitude/phase in I/Q IF signal paths. Referring now to FIG. 2D, an input spectrum at RF is shown using a receiver in accordance with an embodiment. FIGS. 2E-2F show the spectrum after complex mixing with −LO and +LO frequencies, respectively. Note that +LO mixing is undesired and results from mismatches. Ideally, FIG. 2F has no spectral energy. Thus as seen in FIG. 2G, the resulting signal, after IF filtering suffers from image signal, in that I/Q mismatches in the LO or IF path causes undesired image information to fall within the low-IF band and interfere with a desired signal.

The following equations describe the effects of I/Q mismatches on image rejection. Assume an ideal incoming signal having a positive frequency $e^{j\omega t}=\cos\omega t+j\sin\omega t$ [EQ. 1]. Due to mismatches, the actual signal resulting from gain and phase errors is:

$$\cos\omega t + j(1+\alpha)\sin(\omega t+\phi) \approx e^{j\omega t} + \left[\frac{-\alpha}{2}+j\frac{\phi}{2}\right]e^{-j\omega t}, \quad \text{[EQ. 2]}$$

where $\alpha$ is the gain error and $\phi$ is the phase error. Image rejection may be evaluated in accordance with the following equation:

$$\approx -10\log\left[\left(\frac{\alpha}{2}\right)^2+\left(\frac{\phi}{2}\right)^2\right]. \quad \text{[EQ. 3]}$$

In one example, a 1% gain mismatch leads to image rejection of 46.0 dB, and a 1° phase mismatch leads to image rejection of approximately 41.2 dB.

Using an embodiment, amplitude/phase may be adjusted or corrected in the IF signal path prior to any complex filtering, e.g., using a passive network coupled between a PGA and a complex IF filter. By way of this passive network, amplitude/phase tuning are orthogonal. Using an embodiment, IRCAL may be performed in the IF band with minimal effects to a receiver design. Still further, convergence of these orthogonal amplitude/phase corrections does not undo complex filtering and further removes phase tuning of the LO signal path, which would require higher accuracies. With the above Equation 3 for image rejection, assume worst case native image rejection is: 30 dB from only phase mismatch, or 30 dB from only amplitude mismatch. In an embodiment, a corrected IR of approximately 65 dB may be specified. To this end, gain can be controlled in a range of approximately +−6.3%, in 0.1% steps, and phase can be controlled in a range of approximately +−3.6 degrees with 0.064 degree steps.

Figure 3:
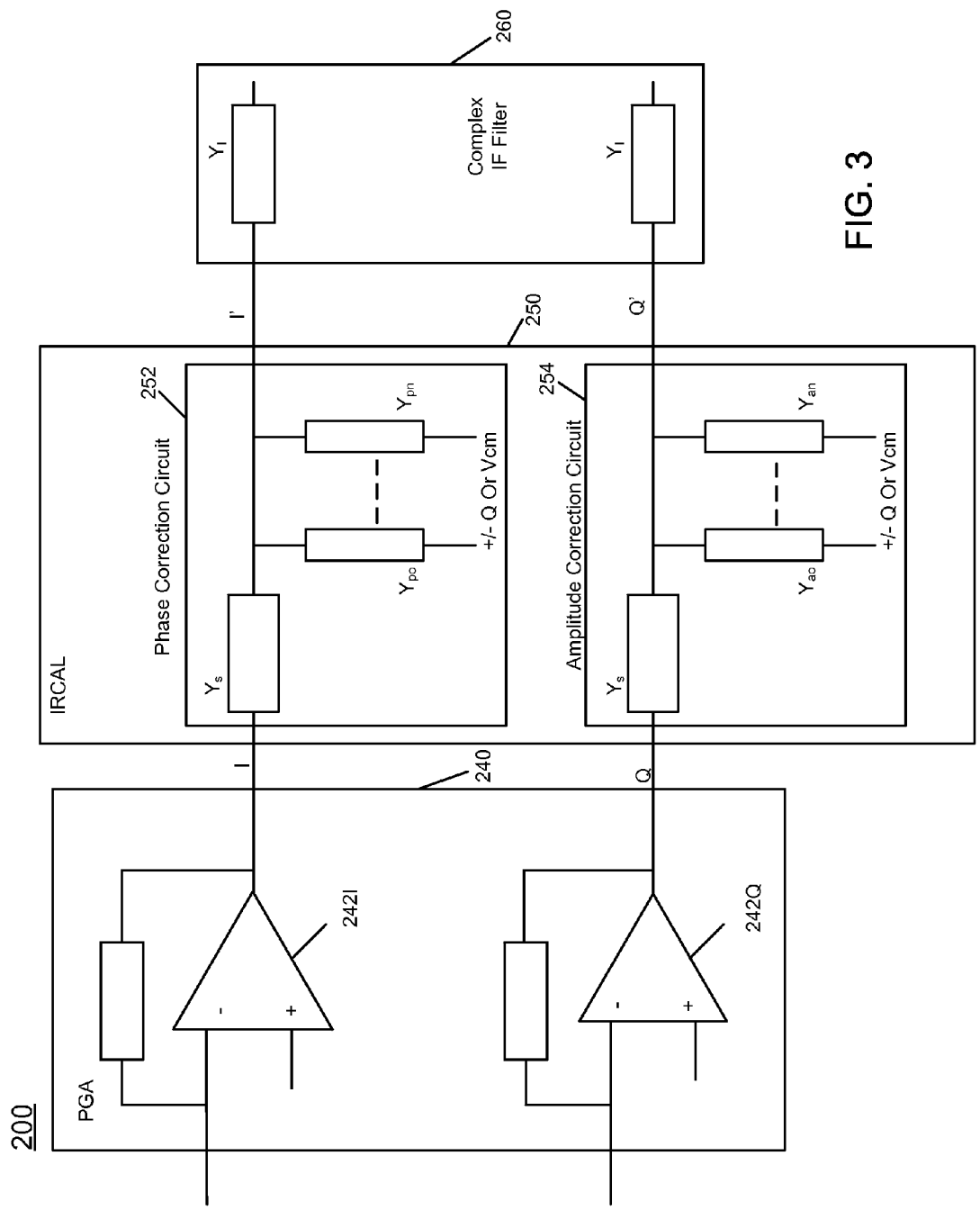
FIG. 3 is a block diagram of an image rejection calibration (IRCAL) circuit in accordance with an embodiment.

Referring now to FIG. 3, shown is a block diagram of an IRCAL circuit in accordance with an embodiment. As shown in FIG. 3, a limited portion of a receiver 200 is shown, namely an input to an IRCAL circuit 250 and an output of the circuit. On the input side, incoming complex signals are received from a PGA 240, which includes separate programmable gain amplifiers 242I/242Q for the in-phase and quadrature signal paths, respectively. While shown in FIG. 3 as single-ended signals for purposes of illustration simplicity, understand that in a given embodiment, the receiver may be configured as a differential complex receiver and thus differential signals are processed in both the I and Q signal paths.

As further illustrated in FIG. 3, IRCAL circuit 250 is formed of an independent phase correction circuit 252 and an independent amplitude correction circuit 254. In general, both circuits may be implemented as passive networks using combinations of series and parallel admittance elements. Although embodiments vary, in different implementations the admittance elements may take the form of resistors, capacitors, inductors or so forth.

First with reference to phase correction circuit 252, a series admittance $Y_S$ is configured on the in-phase signal path. In addition, a plurality of controllable admittances $Y_{p0}$-$Y_{pn}$ are coupled between the in-phase signal path and a selected node. More specifically, each of these admittance elements can be coupled to a selected one of a positive quadrature signal path node, a negative quadrature signal path node, or a common mode voltage node, which may be the common mode voltage between the positive and negative quadrature signal path signals. As will be described further, each of these controllable admittance elements may be selectively controlled, e.g., responsive to a control value (provided to one or more switches or other selection circuits) to couple the given admittance element to the selected node. Note however that during operation each of the controllable admittance elements remains active; it is controlled to be coupled to a different node. Because all the admittance elements remain coupled to the in-phase signal path, the output admittance of the IRCAL circuit remains unchanged, regardless of the programming of the elements between these different nodes.

In similar fashion, amplitude correction circuit 254 includes a series admittance $Y_s$ configured on the quadrature signal path. In addition, a plurality of controllable admittance $Y_{a0}$-$Y_{an}$ are coupled between the quadrature signal path and a selected node. More specifically, each of these admittance elements can be coupled to a selected one of the positive quadrature signal path node, the negative quadrature signal path node, or the common mode voltage node between the positive and negative quadrature signal path signals. As above described, each of these controllable admittance elements may be selectively controlled responsive to a control value to couple the given admittance element to the selected node. And as above, because all the admittance elements remain coupled to the quadrature signal path, the output admittance of IRCAL remains unchanged, regardless of the programming of the elements between these different nodes.

As such, the IF signals output by IRCAL circuit 250, I' and Q', have been corrected of substantially all image information. A complex filter (not fully shown in FIG. 3) can be implemented using serial admittances at input. In an embodiment in which the admittances take the form of resistors, $Y_s$ may be approximately equivalent to a one kiloohm resistance, while $Y_s$ of complex filter 260 may have an equivalent resistance value of approximately 100 kiloohms.

Note that the number of controllable admittance elements can vary in different embodiments. In one implementation, 6 controllable admittance elements may be provided, each binary weighted. Of course understand that in other embodiments, the controllable admittance elements may be equally weighted or have another weighting, such as a non-radix 2 weighting.

With reference to IRCAL circuit 250, the following equations set forth the resulting image corrected outputs I' and Q'.

$$I' = \frac{Y_s}{Y_t}\left[I \pm \left(\frac{Y_{ph}}{Y_s}\right)Q\right] \quad \text{[EQ. 4]}$$

$$Q' = \frac{Y_s}{Y_t}\left[1 \pm \left(\frac{Y_{amp}}{Y_s}\right)Q\right] \quad \text{[EQ. 5]}$$

where $Y_t=Y_s+Y_I+Y_5+Y_4+\ldots+Y_0$, where $Y_t$ is the total admittance, and where $Y_I$ is the input admittance of the complex filter.

$Y_{ph}=Y_i+\ldots$ Connected to $+Q$ (or $-Q$) in $I$ branch.

$Y_{amp}=Y_i+\ldots$ Connected to $+Q$ (or $-Q$) in $Q$ branch.

Note that the design of IRCAL circuit 250 does not have 100% symmetrical loading, given the cross-coupling of phase correction circuit 252 to the quadrature signal path. However, reduced hardware, size and power consumption can be realized with suitable performance in this asymmetrical design of FIG. 3. In other embodiments to provide such symmetry, a phase correction circuit (and gain correction circuit) having both in-phase signal path and quadrature signal path portions may be provided.

Figure 4:
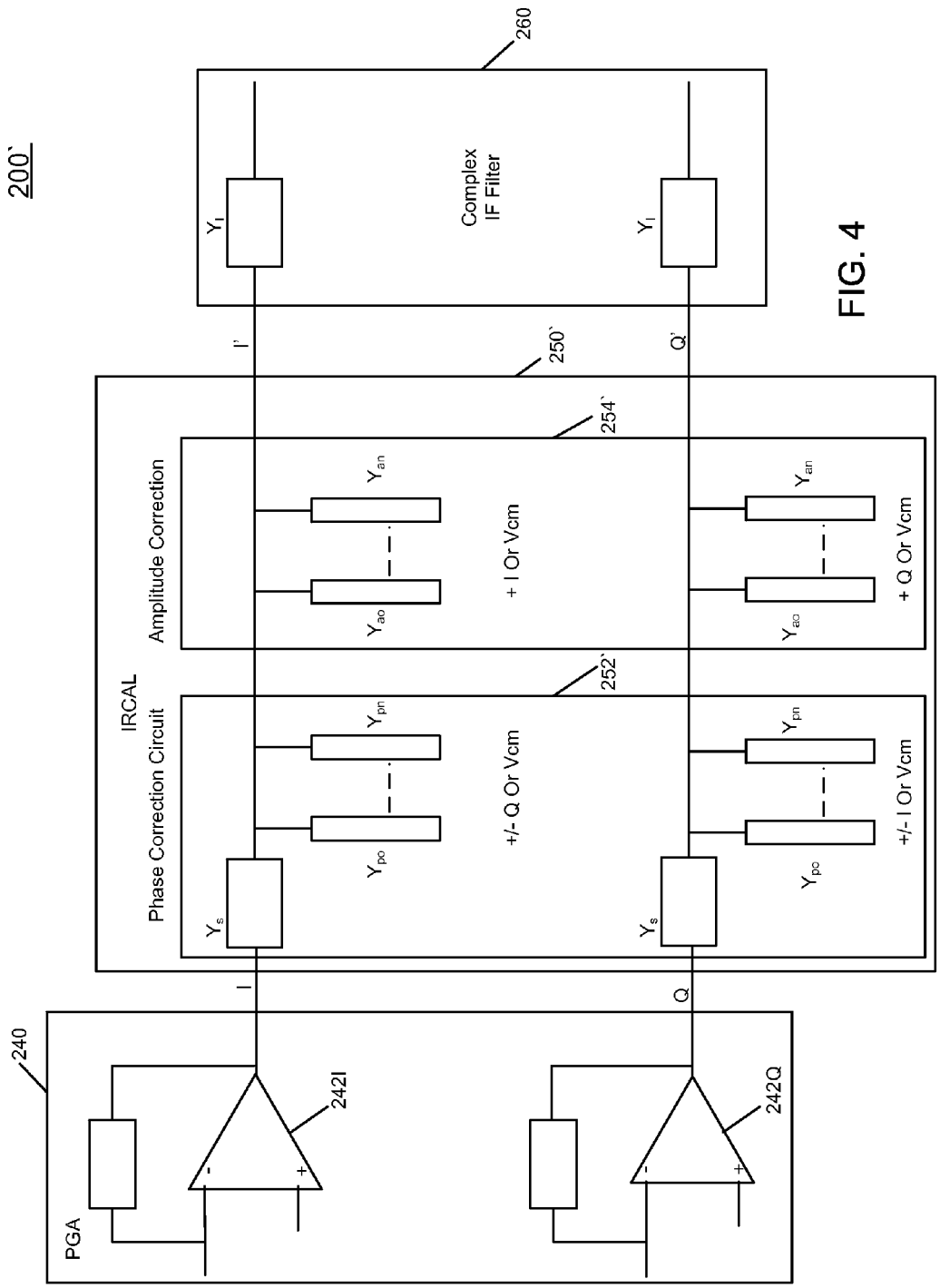
FIG. 4 is a block diagram of an IRCAL circuit in accordance with another embodiment.

Referring now to FIG. 4, shown is a block diagram of an IRCAL circuit in accordance with another embodiment. As shown in FIG. 4, IRCAL circuit 250' of receiver 200' similarly includes a phase correction circuit 252' and an amplitude correction circuit 254'. Note here that both phase correction circuit 252' and amplitude correction circuit 254' have portions coupled to both the in-phase and quadrature signal paths. In addition, note the cross-coupling of the different branches of phase correction circuit 252' to the opposite signal path or a common voltage mode node. Instead, the different branches of the amplitude correction circuit 254' couple to the corresponding signal path itself or a common voltage mode node. In other circumstances, IRCAL circuit 250' may be configured substantially the same as described above with regard to FIG. 3, with the same number of controllable admittance elements, same admittance values and so forth. The embodiment shown in FIG. 4 may provide a greater symmetry than IRCAL circuit 250, at the expense of greater complexity and area consumption and further may have greater signal attenuation.

Referring now to FIG. 5A, shown is a schematic diagram of one implementation of a correction circuit implemented using passive circuits. As seen in FIG. 5A, correction circuit 310 includes a series resistance $R_s$ adapted to the signal path itself. In addition, a plurality of parallel resistors $R_1$-$R_6$ may couple between the signal path and a selected one of a plurality of nodes (positive or negative portions of a given signal path or a common mode voltage node there between). In turn, correction circuit 310 couples to a series resistance $R_1$, e.g., of a complex filter coupled to the output of the correction circuit. In one example, $R_s$ may be a 1 kohm resistor while $R_1$-$R_6$ may be a set of binary weighted resistors with the first resistance having a value of 31.25 kohm and the last resistance having a value of 1 megaohm. In turn, the series resistance $R_1$ may be a 100 kohm resistance.

Referring now to FIG. 5B, shown is a schematic diagram of a different example of a correction circuit in accordance with an embodiment. As seen in FIG. 5B, correction circuit 320 includes a series capacitance $C_s$ adapted to the signal path itself. In addition, a plurality of parallel capacitors $C_1$-$C_6$ may couple between the signal path and a selected one of a plurality of nodes (positive or negative portions of a given signal path or a common mode voltage node therebetween). In turn, correction circuit 320 couples to a series resistance $R_1$ of the complex filter coupled to the output of the correction circuit. In one example, $C_s$ may be a 32 pF capacitor, and $C_1$-$C_6$ may be a set of binary weighted capacitors with the first capacitor having a value of 1.0 pF and the last capacitor having a value of 0.03125 pF. In turn, the series resistance $R_1$ may be a 100 kohm resistance.

Figure 6:
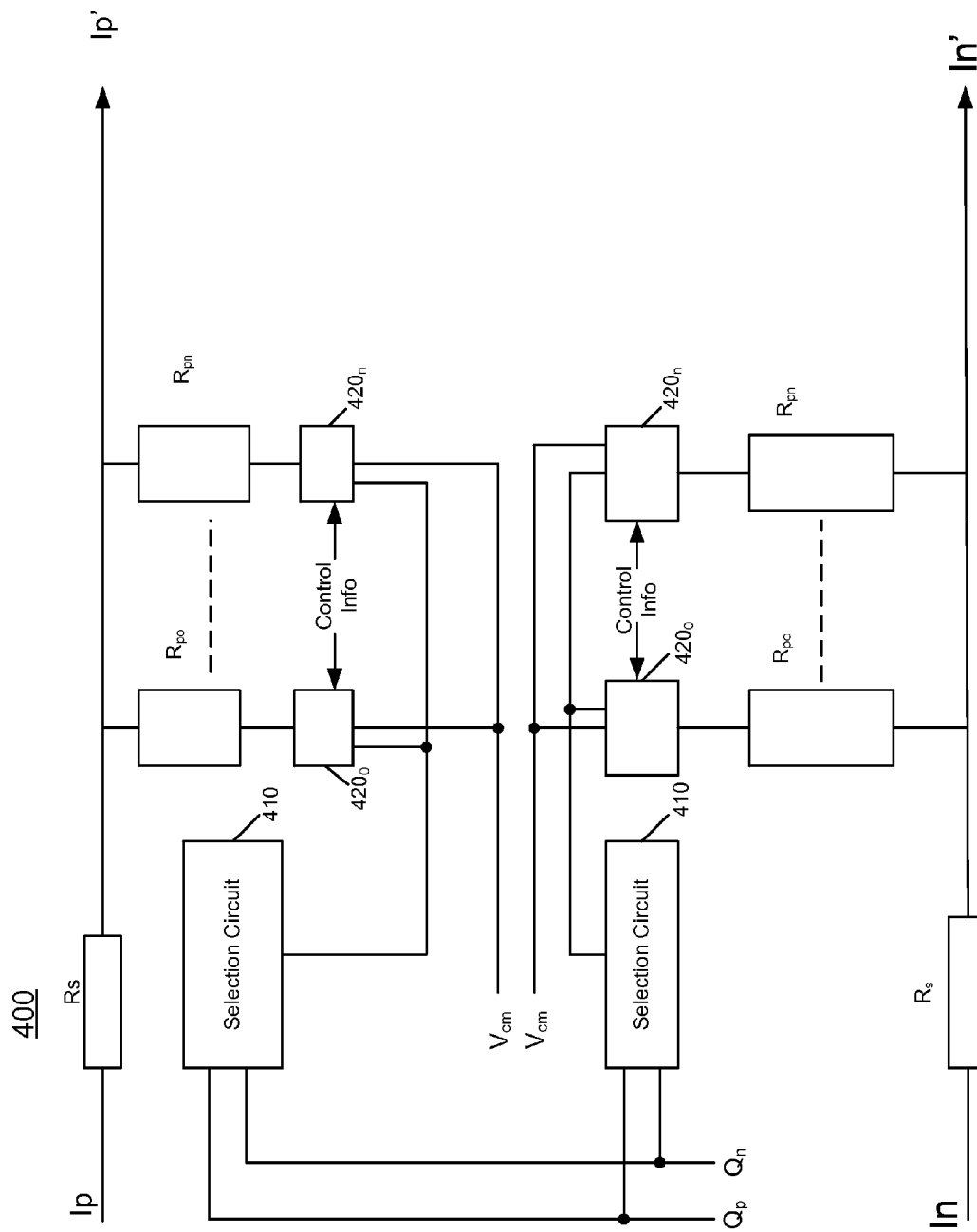
FIG. 6 is a block diagram of an implementation of a portion of an IRCAL circuit in accordance with an embodiment.

Referring now to FIG. 6, shown is a block diagram of an implementation of a portion of an IRCAL circuit in accordance with an embodiment. For ease of illustration, IRCAL circuit 400 shows only the implementation of a phase correction circuit for an asymmetric arrangement. As seen in this complex receiver implementation, an incoming differential IF circuit real portion includes positive and negative paths to process the signals $I_p$ and $I_n$, respectively. The phase correction circuit includes a series resistor $R_s$ and a plurality of parallel resistors $R_{p0}$-$R_{pn}$. As seen, to control the amount of resistance presented by the controllable elements $R_{p0}$-$R_{pn}$, a first selection circuit 410 is present to receive the incoming IF signals of the quadrature signal path (namely $Q_P$ and $Q_N$). Based on control information (e.g., received from a microcontroller or other control logic that may obtain this information from a configuration storage), a selected one of these quadrature signal portions is provided to second selection circuits $420_0$-$420_n$. As seen, each of these selection circuits further receives a common mode voltage $V_{cm}$ from a common mode voltage node. Second selection circuits 420 are configured to switch a selected one of the common mode voltage or the given quadrature signal polarity to the given controllable element based on control information (which may be received from the same source as for selection circuit 410).

As seen, similar circuitry is present for the negative signal path. Also, understand while not shown for ease of illustration, a gain correction circuit may similarly be adapted to the quadrature signal path. Note that in such circuit, the corresponding first selection circuit would also select one of the positive and negative portions of the quadrature signal. As to FIG. 6, understand that different sources of control information may be used for the selection of nodes to couple to the controllable admittance elements (including dynamic control information in an implementation that calculates correction values during runtime). Further, understand while shown at this high level in the embodiment of FIG. 6, many variations and alternatives are possible.

Figure 7A:
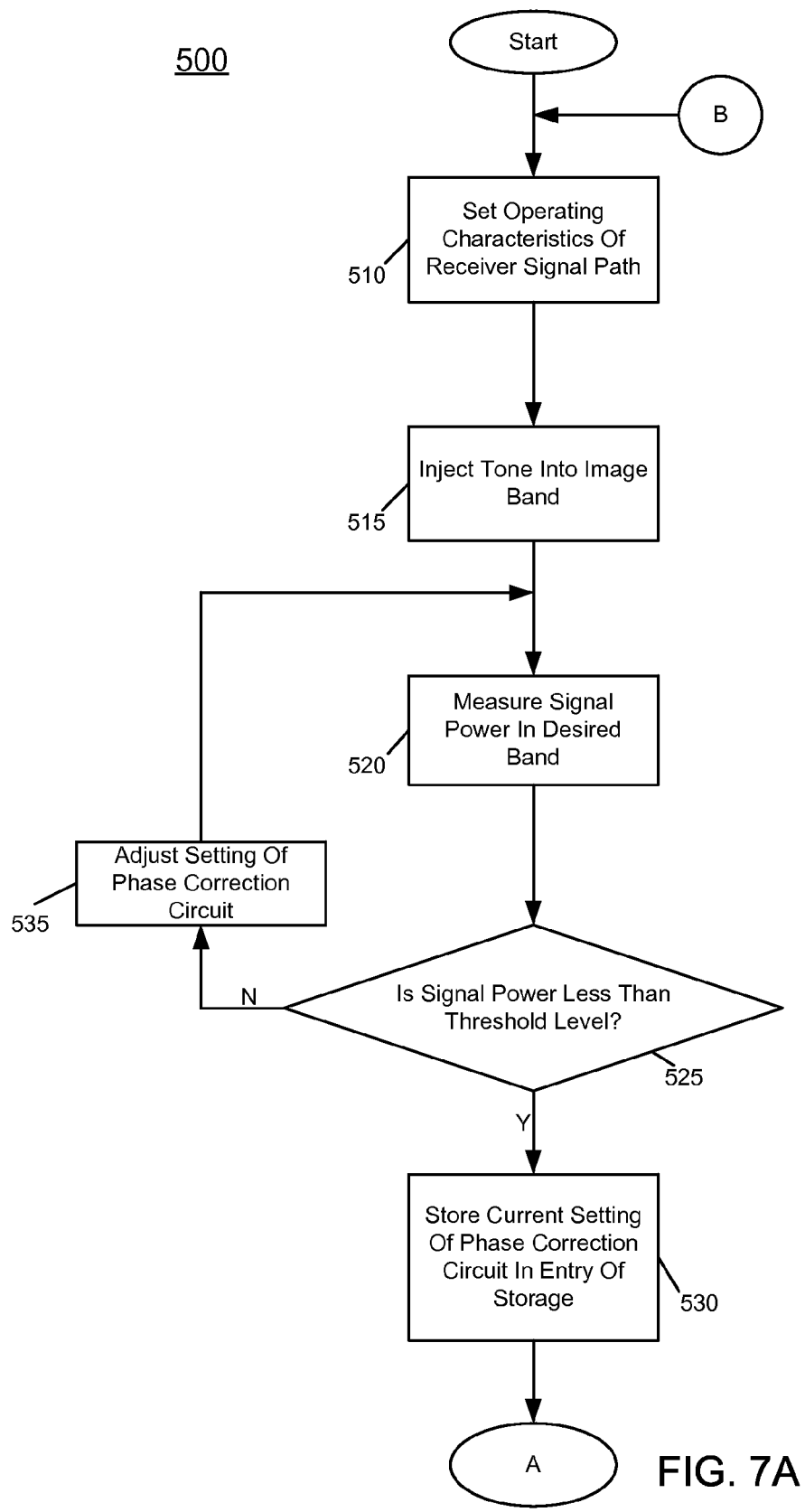
FIGS. 7A-7B are flow diagrams of a method for determining control values for an image rejection calibration circuit in accordance with an embodiment.
Figure 7B:
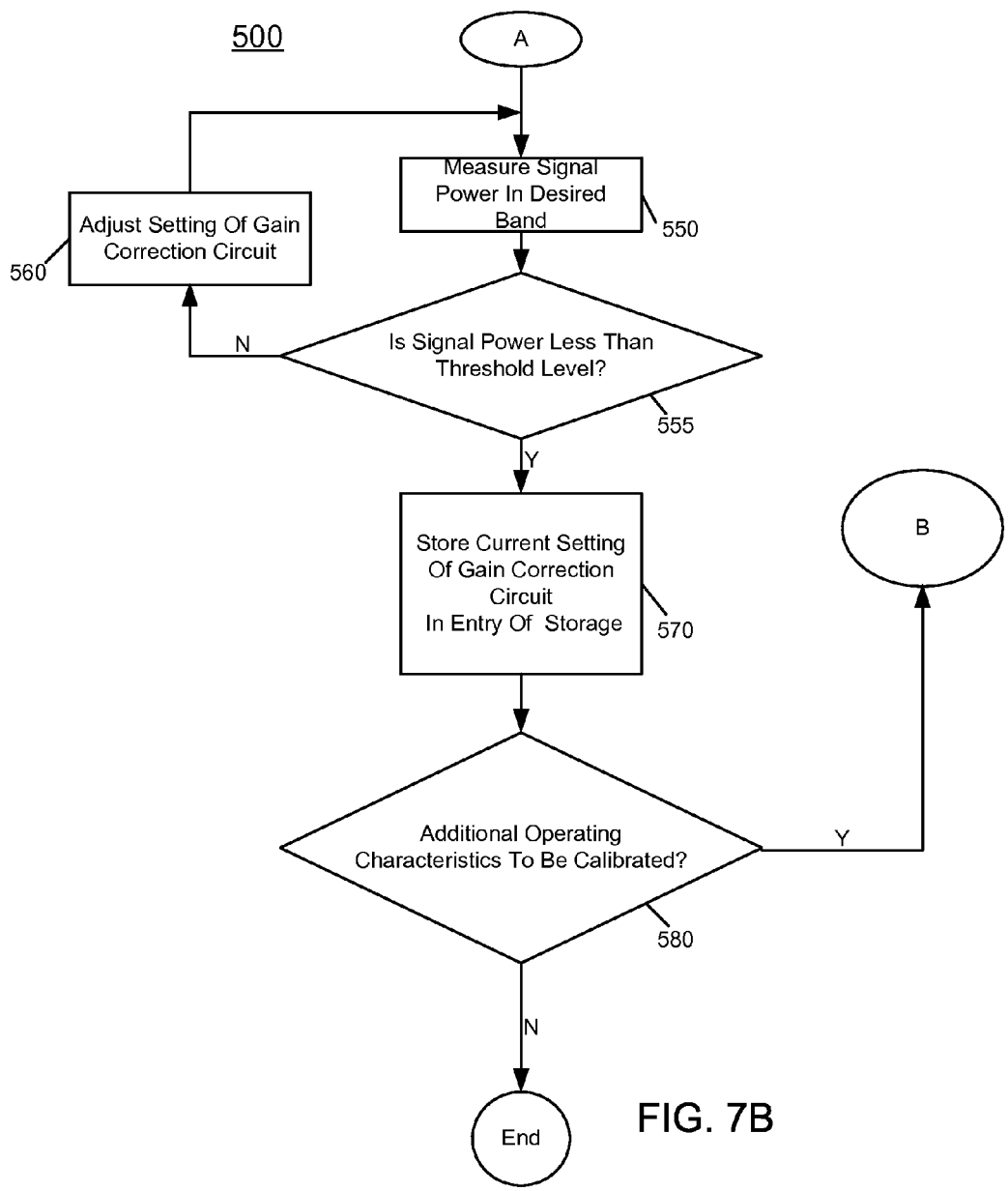

Referring now to FIGS. 7A-7B, shown are flow diagrams of a method for determining control values for an image rejection calibration circuit in accordance with an embodiment. As shown in FIG. 7A, method 500 may be performed during manufacture of a device including a receiver having an IRCAL circuit as described herein. As part of manufacturing testing and configuration of the product, the receiver can be tested using a tone injected into an image band, and measuring information regarding a processed version of this signal, e.g., in a digital portion of the receiver. Based on this information and other operating characteristics of the receiver, control values can be independently and orthogonally generated for both the phase correction portion and the gain correction portion of the IRCAL circuit and stored into an appropriate location, e.g., into a calibration table of a non-volatile storage of the device.

As seen in FIG. 7A, method 500 begins by setting operating characteristics of a receiver signal path (block 510). Such operating characteristics may include an operating voltage of the receiver, filter settings for a complex filter of the signal path, among other parameters. Understand that in addition to setting the operating characteristics in the receiver signal path, an initial setting for the IR calibration circuit also may be set. This initial setting may vary, in different implementations. However, in one embodiment the initial setting for a phase correction circuit may be to control all controllable admittance elements of the phase correction circuit to be coupled in parallel between the in-phase signal path and a common mode voltage node. Similarly, for the gain correction circuit, the initial setting may be to control all controllable admittance elements to be coupled in parallel between the quadrature signal path and a common mode voltage node.

Thereafter, at block 515 a tone is injected into the image band. In an embodiment, the receiver (or another portion of a product in which the receiver is incorporated) may include a tone generation circuit to generate a tone at a selected frequency. In an embodiment in which a receiver is configured for low-side LO operation, meaning that during operation an LO is controlled to generate an LO frequency below a desired channel frequency (such that an image is present on the low side of the desired band), this tone may be set at a frequency slightly less than the LO frequency.

Thereafter, control passes to block 520 where signal power in the desired band (which may be at the desired channel frequency) is measured. That is, the receiver is operated to process the information of both the in-phase and quadrature signal paths. Note that without reception of any other signal other than this tone, the only information being processed in the desired band relates to image signal. In an embodiment, the signal power in the desired band may be measured in a digital portion, after the signal is fully processed through the IF signal path, digitized and then provided to digital processing circuitry. In one embodiment, a received signal strength indicator (RSSI) value may be used to perform the measurement.

Still referring to FIG. 7A, control next passes to diamond 525 where it can be determined whether the signal power as measured above exceeds a threshold level. In an embodiment, this threshold level may be a given power level, e.g., based on a receiver blocking performance specification, or may be a minimum (that depends on the gain error, i.e., a minima in power vs. gain correction). If the signal power is determined not to exceed this threshold, control passes to block 530, where the current setting of the phase correction circuit may be stored. More specifically, this value may be stored in an entry of the non-volatile storage. In a given implementation, a table to be stored in the non-volatile storage includes multiple entries, where each entry is associated with a particular set of operating characteristics of the receiver (e.g., operating voltage, filter setting, gain setting or so forth), and the values to be stored in the entry may correspond to the control settings for the phase correction circuit (e.g., a control value to control a switching network of the phase correction circuit to enable the appropriate setting of controllable admittances, as described above). Furthermore, this same entry may also include a given setting for the gain correction circuit (as discussed further below).

Thereafter, continued calibration operations at the current operating characteristics of the receiver signal path may be performed, for purposes of calibrating the gain correction circuit, as described with reference to FIG. 7B.

Still with reference to FIG. 7A, if instead at diamond 525 it is determined that the signal power does exceed the threshold level, control passes to block 535 where a setting of the phase correction circuit may be adjusted. For example, one or more additional controllable admittance elements may be switched from a common mode voltage node to the quadrature signal path (either the positive or negative portion of the signal path, in a differential implementation). Thereafter, control passes back to block 520, discussed above for an updated signal power measurement in the desired band and continued operation of the method.

After setting the control value for the phase correction circuit, control continues to block 550 of FIG. 7B, where signal power in the desired band is measured. Next at diamond 555, it can be determined whether the signal power as measured above exceeds the threshold level. If the signal power is determined not to exceed this threshold, control passes to block 570, where the current setting of the gain correction circuit may be stored into an entry of the non-volatile storage (e.g., the same entry in which the setting for the phase correction circuit is stored). Then it can be determined whether correction values are to be generated for additional operating characteristics of the receiver at diamond 580 (e.g., different operating voltage or filter settings). If so, method 500 may be performed again; otherwise the method concludes.

If it is determined that the signal power does exceed the threshold level, control passes to block 560 where a setting of the gain correction circuit may be adjusted. For example, one or more additional controllable admittance elements may be switched from a common mode voltage node to the quadrature signal path (either the positive or negative portion of the signal path, in a differential implementation). Thereafter, control passes back to block 550, discussed above for an updated signal power measurement in the desired band and continued operation of the method.

Embodiments can be implemented in many different types of systems incorporating an RF receiver. Examples include broadcast radios, satellite radios, wireless communication systems including wide area and wireless local area network systems. Furthermore, embodiments can be incorporated into a variety of integrated circuits such as microcontroller units (MCUs) such as for embedded systems, Internet-connected devices and so forth.

Figure 8:
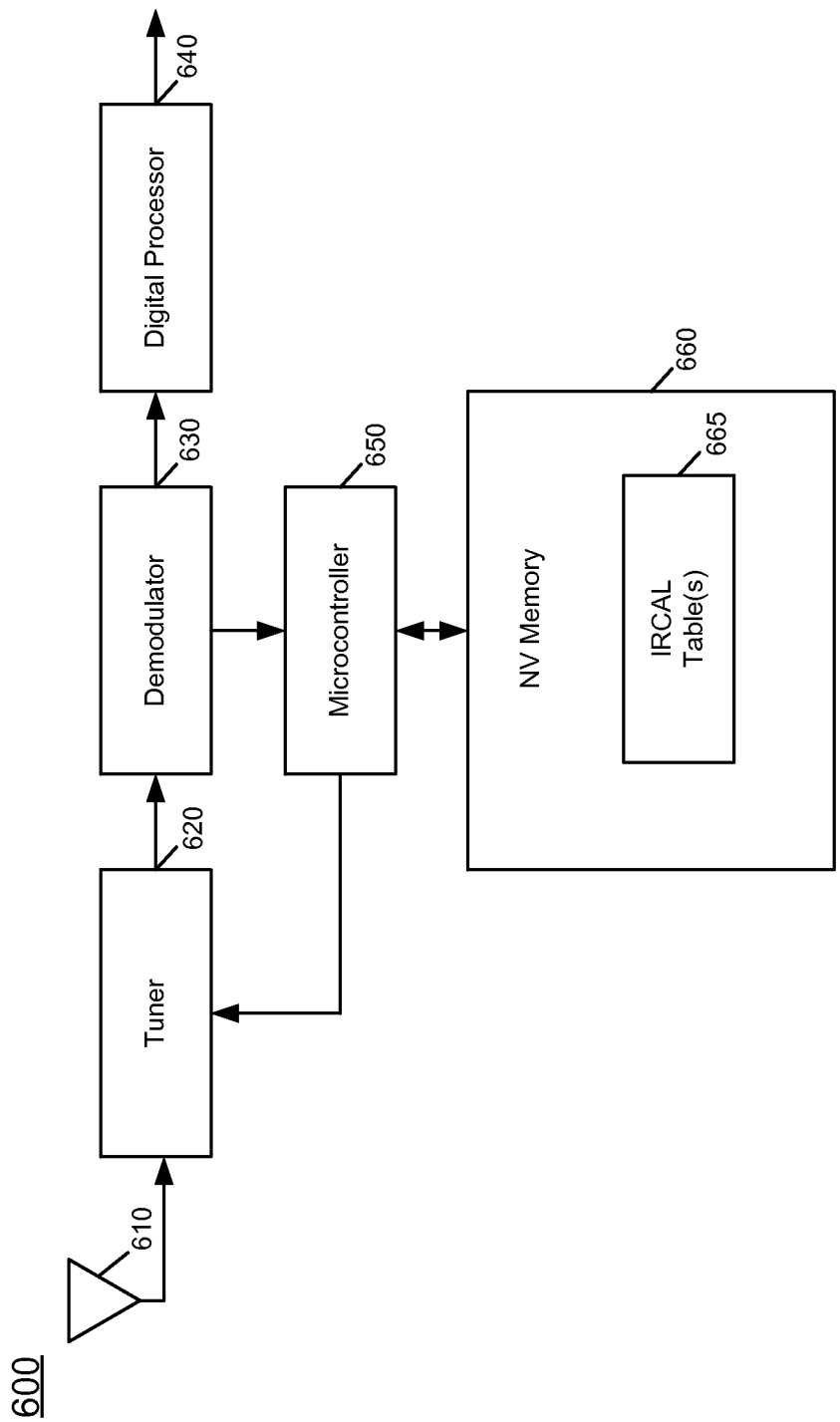
FIG. 8 is a block diagram of a system in accordance with an embodiment.

Referring now to FIG. 8, shown is a block diagram of a system in accordance with an embodiment. As shown in FIG. 8, system 600 is any type of end user product, an embedded system or so forth, or integrated circuit to be incorporated into such product. As seen, system 600 includes an antenna 610. Other than this antenna, all other components shown in FIG. 8 may be implemented within a single integrated circuit and can be formed on a single semiconductor die, in some examples. From antenna 610, RF signals are provided to a tuner 620 which may be a complex tuner having a low IF architecture, such as described above with regard to FIG. 1. Tuner 620 provides downconverted and digitized signals to a demodulator 630, which demodulates the digitized information and provides it to a digital processor 640 for desired processing.

To provide control of an IRCAL circuit within tuner 620, a microcontroller 650 is present and may provide control signals to tuner 620 to cause switching or other control of controllable elements of the IRCAL circuit. More specifically, these control signals may be obtained from one or more IRCAL tables 665 stored in a non-volatile memory 660. To enable communication of control signals, microcontroller 650 may execute instructions stored in a non-transitory storage medium, included within or otherwise accessible to the microcontroller. In some embodiments, this table may be generated during manufacture using method 500 of FIGS. 7A and 7B, which in an embodiment also may be implemented as instructions stored in a non-transitory storage medium accessible to microcontroller 650 and/or another programmable logic. Of course in other embodiments, dynamic control of an IRCAL circuit can occur using microcontroller 650, which receives feedback information from a demodulator 630. Understand while shown at this high level in FIG. 8, many variations and alternatives are possible.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
a mixer to receive a radio frequency (RF) signal and downconvert the RF signal into a second frequency signal;
a programmable gain amplifier (PGA) coupled to the mixer to amplify the second frequency signal;
an image rejection (IR) circuit coupled to the PGA to orthogonally correct a gain and a phase of the amplified second frequency signal to output a corrected amplified second frequency signal; and
a complex filter to filter the corrected amplified second frequency signal.

2. The apparatus of claim 1, wherein the IR circuit comprises:
a first controllable admittance network coupled to an in-phase signal path of the apparatus; and
a second controllable admittance network coupled to a quadrature signal path of the apparatus.

3. The apparatus of claim 2, wherein the IR circuit further comprises:
a third controllable admittance network coupled to the in-phase signal path of the apparatus; and
a fourth controllable admittance network coupled to the quadrature signal path of the apparatus.

4. The apparatus of claim 2, wherein the first controllable admittance network is cross-coupled to the quadrature signal path.

5. The apparatus of claim 4, further comprising a first selection circuit to controllably couple each of a plurality of admittance elements of the first controllable admittance network to a selected one of a first portion of the quadrature signal path, a second portion of the quadrature signal path, or a common mode voltage node.

6. The apparatus of claim 5, further comprising a controller to send a control signal to the first selection circuit based on at least one operating characteristic of the apparatus.

7. The apparatus of claim 6, further comprising a non-volatile memory coupled to the controller, the non-volatile memory to store a plurality of entries each to store a control value to control at least the first selection circuit.

8. The apparatus of claim 2, wherein the first controllable admittance network comprises a phase correction circuit and the second controllable admittance network comprises a gain correction circuit.

9. The apparatus of claim 8, wherein the first controllable admittance network comprises:
a first admittance element coupled in series with the in-phase signal path; and
a plurality of second admittance elements to couple in parallel between the in-phase signal path and a selected one of a first portion of the quadrature signal path, a second portion of the quadrature signal path, or a common mode voltage node.

10. The apparatus of claim 8, wherein the second controllable admittance network comprises:
a third admittance element coupled in series to the quadrature signal path; and
a plurality of fourth admittance elements to couple in parallel between the quadrature signal path and a selected one of a first portion of the quadrature signal path, a second portion of the quadrature signal path, or a common mode voltage node.

11. The apparatus of claim 1, wherein an input admittance and an output admittance of the IR circuit is to be static regardless of switching of the IR circuit.

12. The apparatus of claim 1, wherein the IR circuit comprises a passive circuit.

13. An apparatus comprising:
a complex mixer to receive a radio frequency (RF) signal and downconvert the RF signal into a complex second frequency signal having an in-phase signal and a quadrature signal;
an image rejection (IR) circuit coupled to the mixer to correct a gain and a phase of the complex second frequency signal to output a corrected complex second frequency signal, the IR circuit comprising:
a first gain element to amplify the in-phase signal;
a phase correction circuit to correct a phase of the quadrature signal;
a summer to combine the amplified in-phase signal and the phase corrected quadrature signal and output a summed in-phase signal; and
an amplitude correction circuit to correct an amplitude of the quadrature signal and output an amplitude corrected quadrature signal; and
a complex filter to filter the summed in-phase signal and the amplitude corrected quadrature signal.

14. The apparatus of claim 13, wherein the phase correction circuit comprises a first passive network and the amplitude correction circuit comprises a second passive network.

15. The apparatus of claim 14, wherein the first passive network comprises:
a first series admittance element; and
a first plurality of parallel admittance elements coupled to a first node of the first series admittance element and a selected one of a positive quadrature signal path node, a negative quadrature signal path node, and a common mode voltage node.

16. The apparatus of claim 15, wherein the second passive network comprises:
a second series admittance element; and
a second plurality of parallel admittance elements coupled to a first node of the second series admittance element and a selected one of at least a positive in-phase signal path node and the common mode voltage node.

17. A receiver comprising:
a complex mixer to downconvert a radio frequency (RF) signal to a complex intermediate frequency (IF) signal;
an IF signal path coupled to the complex mixer, the IF signal path comprising:
an in-phase signal path to receive an in-phase IF signal, the in-phase signal path including a phase correction circuit comprising:
a first series admittance element; and
a first plurality of parallel admittance elements to couple between the in- phase signal path and a selected one of a positive quadrature signal path node, a negative quadrature signal path node, and a first common mode voltage node;
a quadrature signal path to receive a quadrature IF signal, the quadrature signal path including a gain correction circuit comprising:
a second series admittance element; and
a second plurality of parallel admittance elements to couple between the quadrature signal path and a selected one of the positive quadrature signal path node, the negative quadrature signal path node, and a second common mode voltage node.

18. The receiver of claim 17, further comprising a first selection circuit to controllably couple each of the first plurality of parallel admittance elements to the selected one of the positive quadrature signal path node, the negative quadrature signal path node, or the first common mode voltage node.

19. The receiver of claim 18, further comprising a controller to send a control signal to the first selection circuit based on one or more operating characteristics of the receiver.

20. The receiver of claim 17, wherein:
the phase correction circuit further comprises:
   a third series admittance element; and
   a third plurality of parallel admittance elements to couple between the quadrature signal path and a selected one of a positive in-phase signal path node, a negative in-phase signal path node, and a third common mode voltage node; and
the gain correction circuit further comprises:
   a fourth series admittance element; and
   a fourth plurality of parallel admittance elements to couple between the quadrature signal path and a selected one of the positive quadrature signal path node, the negative quadrature signal path node, and the second common mode voltage node.

\* \* \* \* \*